Figure 1:
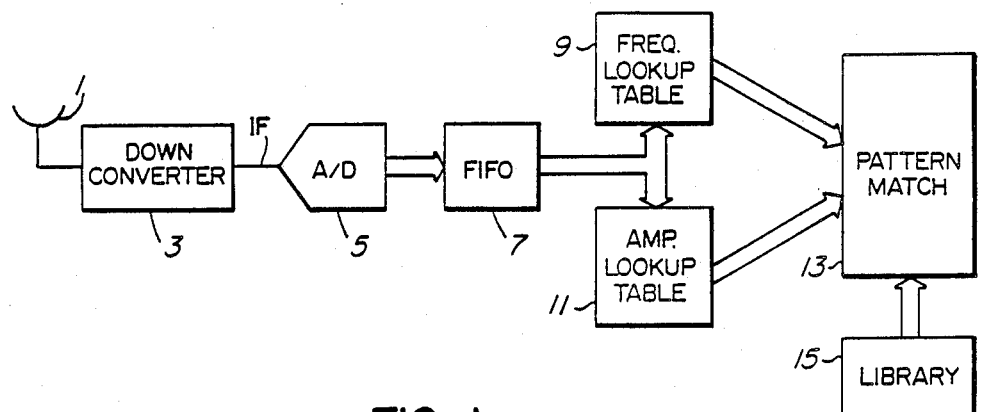

United States Patent [19]
Langner

[11] Patent Number: 4,928,105
[45] Date of Patent: May 22, 1990

[54] INTRAPULSE RADAR RECEIVER

[75] Inventor: Paul Langner, Kanata, Canada

[73] Assignee: Telemus Electronic Systems, Inc., Ontario, Canada

[21] Appl. No.: 356,200

[22] Filed: May 24, 1989

[30] Foreign Application Priority Data

May 25, 1988 [CA] Canada ................................. 567643

[51] Int. Cl.$^5$ ........................ G01S 7/44; G01R 23/02
[52] U.S. Cl. ................................. 342/192; 324/78 D; 364/484; 342/13
[58] Field of Search .................... 342/192, 13, 195; 324/77 D, 78 D; 364/484-486

[56] References Cited

U.S. PATENT DOCUMENTS

| | | | |
|---|---|---|---|
| 4,336,541 | 6/1982 | Tsui et al. | 342/192 X |
| 4,547,727 | 10/1985 | Tsui et al. | 342/192 X |
| 4,633,516 | 12/1986 | Tsui | 342/192 X |
| 4,700,191 | 10/1987 | Manor | 342/13 |
| 4,723,216 | 2/1988 | Premerlani | 364/484 |

FOREIGN PATENT DOCUMENTS

63-285472 11/1988 Japan ................................. 324/78 D

Primary Examiner—Thomas H. Tarcza
Assistant Examiner—Gilberto Barrón, Jr.
Attorney, Agent, or Firm—Antonelli, Terry, Stout & Kraus

[57] ABSTRACT

A microwave frequency detection receiver for receiving an incoming analog radar signal, converting the radar signal into digital form, and performing a table lookup algorithm for detecting frequency and amplitude of the incoming signal with respect to time. The table lookup algorithm is in the form of a three point best-fit sinusoidal approximation of frequency and amplitude for processing successive digital input signal samples processed in groups of three. Digital sampling of the input signal coupled with the novel table lookup algorithm results in detection of frequency and amplitude characteristics on an intrapulse basis.

19 Claims, 1 Drawing Sheet

INTRAPULSE RADAR RECEIVER

This invention relates in general to microwave signal frequency and amplitude measurement devices, and more particularly to a digital microwave intrapulse receiver.

Instantaneous frequency measurement (IFM) receivers have been developed for use in electronic warfare, for automatically measuring and displaying the frequency and amplitude of received microwave signals in order to effect electronic support measures, electronic countermeasures and electronic intelligence applications.

The detected frequency and amplitude characteristics of pulsed radar signals are used to sort multiple incoming signals and in order to identify each remote transmitter of the received signals. In particular, it has been found that the profile of frequency and amplitude changes across a received microwave radar signal is a function of the remote transmitter, such characteristics being referred to as primitive invariants. Primitive invariants are characteristics of a transmitter which cannot be deliberately changed and are inherent within the physical structure of the high power components (e.g. magnetrons) of such transmitters. Critical frequency and amplitude characteristics of a received microwave signal pulse have been found to be contained within the leading edge (i.e. first 10%) of the received signal pulses. In fact, the first 10% of each microwave signal pulse is characterized by the greatest rate of change of frequency versus time, which reflects the settling characteristics of pulsed fixed frequency oscillator circuitry associated with the magnetron radar transmitter.

Prior art digital IFM receivers typically utilized one or more delay lines to measure signal frequencies over a wide instantaneous bandwidth on a pulse-by-pulse basis, according to predetermined pulse repetition intervals (PRIs) and in response, generated a digital designation of the detected frequency. The receivers typically exhibited the characteristics of wide radio frequency input bandwidth, relatively accurate frequency measurement capability (typically as much as 14 bit resolution over several megahertz), and wide dynamic range. However, in the event of simultaneous signals, the prior art DIFM receivers typically generated an erroneous frequency output related to harmonics and spurious frequencies of the two or more simultaneous signals. Furthermore, the throughput time of prior art DIFM receivers has been found to be slow as a result of operating point delays in the diodes associated with discriminator circuitry of the receivers. Thus, it has been found that the critical information contained in the first 10% of each microwave signal pulse received by such prior art DIFMs is often lost.

Also, since most present day radar transmitters utilize staggered pulse trains of two or more PRIs and randomly variable jitter, prior art pulse-by-pulse analysis of received incoming signals has been found to be very difficult.

In an effort to overcome the disadvantage of prior art systems wherein erroneous frequency output signals were generated in the presence of simultaneous signals, wide band limiting amplifiers have been utilized to restrict frequency detection prior to application of the signals to the DIFM receiver, such that the strongest of the simultaneous signals is transmitted to the receiver while the weaker signals are suppressed. This results in the frequency information pertaining to the weaker signals being lost, and in the event the simultaneous signals are within 6 db of each other, the DIFM receiver typically detects an erroneous frequency related to the harmonics and spurious frequencies characteristic of the simultaneous signals.

Recent developments in microwave receiver technology have led to intrapulse detection systems utilizing digital processing techniques for eliminating the prior art requirement of pulse-by-pulse (i.e. PRI) analysis. Such systems are typically comprised of a delay line discriminator for receiving an incoming microwave radar signal and generating an analog voltage proportional to frequency, an analog-to-digital converter for converting the analog voltage output of the discriminator into digital form, a memory for storing the digitally converted discriminator output signal and a digital signal processor for performing a fast Fourier transform (FFT) on the stored digital data.

However, as discussed above with reference to prior art DIFM systems, it has been found that the throughput time characteristics of present day discriminator circuits results in loss of signal information pertaining to the first 10% (i.e. leading edge) of the received microwave signal pulses. In addition, it has been found that fast Fourier transform processing of the received data requires complex and time-consuming digital calculations which are incompatible with real time detection of microwave frequency and amplitude, as required by modern day electronic warfare systems.

Furthermore, even if the front end discriminator circuitry of more recent prior art microwave receivers was characterized by a sufficiently quick throughput time to capture leading edge frequency and amplitude information, the fast Fourier transform performed on such information would typically lead to erroneous results since frequency modulation within the FFT sample window produces Bessel frequency components in relation to the rapidly changing frequency and amplitude characteristics of the incoming signal.

According to the present invention, an intrapulse microwave signal receiver is provided in which a fast analog-to-digital converter is utilized in lieu of prior art discriminator circuitry. The fast sampling converter captures a complete digital "snapshot" of an incoming microwave signal pulse, including the leading edge thereof. Since it is known that incoming microwave radar signals are roughly sinusoidal over any short period of time, the phase, frequency and amplitude versus time across a received signal pulse may be determined using well known mathematical principles, as described in greater detail below. In particular, according to a preferred embodiment of the present invention, groups of three successive samples of the received and digitally converted signal are applied as address inputs to respective lookup tables for effecting a three point sinusoidal best-fit algorithm to determine the frequency and amplitude of the received signal. Thereafter, pattern matching circuitry may be utilized to correlate the detected frequency and amplitude characteristics of the received signal pulse with those of known radar transmitters, in order to identify the remote radar transmitter in an electronic warfare environment.

By replacing prior art discriminator circuitry with a fast sampling analog-to-digital converter, the leading edge characteristics of a received microwave radar pulse are captured, as contrasted with prior art IFM receivers. Also, the inventive frequency and amplitude lookup table technique for detecting transmitter primitive invariants may be implemented on a real time basis, as contrasted with prior art digital FFT processing of received discriminator output signals.

In general, according to the present invention there is provided an intrapulse microwave radar receiver, comprised of first circuitry for receiving and down-converting an incoming microwave signal and in response generating an intermediate analog signal, second circuitry for receiving and digitizing the intermediate analog signal and in response generating a plurality of digital signal samples, and third circuitry for receiving the digital signal samples in groups of three, performing a three point best-fit sinusoidal approximation of the digital signal samples and in response generating further digital signals representative of the intrapulse frequency and amplitude of the incoming microwave signal with respect to time.

Figure 2:
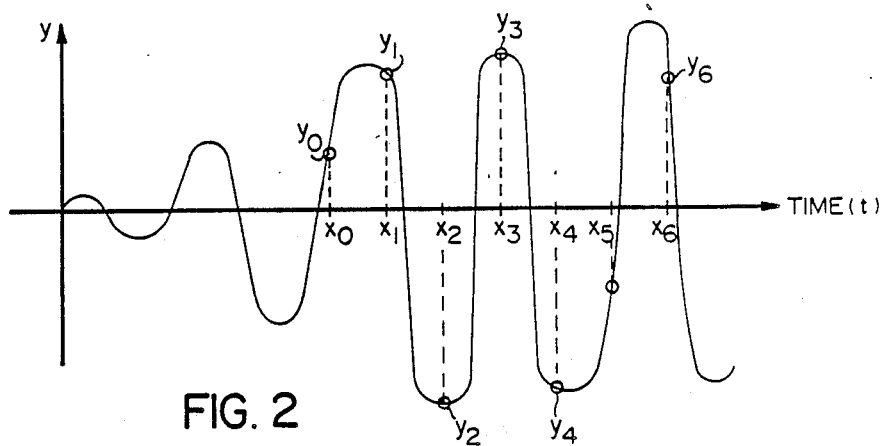
Figure 3:
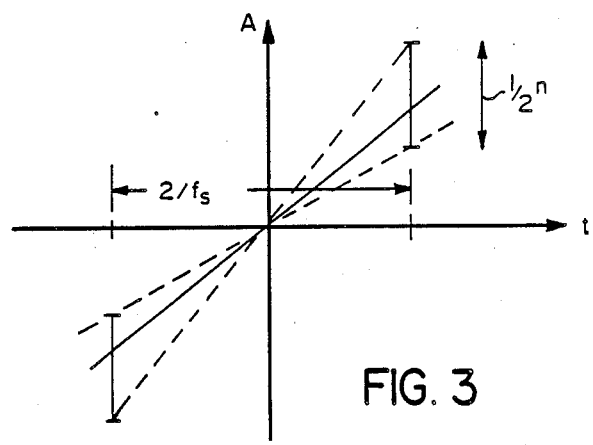

A better understanding of the present invention will be obtained with reference to the detailed description below in conjunction with the following drawings in which FIG. 1 is a block diagram of a digital intrapulse microwave signal receiver in accordance with the present invention, FIG. 2 is a graph illustrating the leading edge of a exemplary incoming pulsed microwave radar signal sampled in accordance with the method of the present invention, and FIG. 3 is a graph of maximum susceptibility to error in frequency detection of pulsed microwave signals in accordance with the present invention.

Turning to FIG. 1, the intrapulse microwave signal receiver of the present invention is illustrated comprised of an antenna 1 for receiving incoming pulsed microwave signals, a down converter 3 for converting the microwave frequency signals to an intermediate frequency analog signal (IF), an analog-to-digital converter 5 for converting the received intermediate frequency signal (IF) into parallel format, and a high speed cache FIFO 7 for temporarily storing the converted digital signal samples received from analog-to-digital converter 5. The FIFO 7 has an output connected to address inputs of respective frequency and amplitude lookup tables 9 and 11 which in turn are connected to a pattern match processor 13 for comparing the output from respective ones of the frequency and amplitude lookup tables with stored signal profiles within a library memory circuit 15, as described in greater detail below.

As discussed above, it can be assumed that the intrapulse waveform of a received microwave signal is roughly sinusoidal over any short period of time. Using this assumption, the phase, frequency and amplitude may be determined with respect to time across a received signal pulse.

In particular, with reference to FIG. 2, the general form sinusoidal signal may be expressed as:

$$y = A \sin(2\pi Bt + C),$$

where A is the amplitude, B is the frequency and C is the phase of the received signal.

The closed form solution for three points $Y_0$, $Y_1$ and $Y_2$, sampled at a constant sampling rate $f_s$ (wherein $f_s$ is greater than at least the Nyquist rate) is:

$A = 2Y_1 \sqrt{(ABS((Y_1Y_2 - Y_1^2)/(Y_0 + 2Y_1 + Y_2)(Y_0 - 2Y_1 + Y_2))}$, and $C = \arcsin(Y_0/A)$ The closed form solution for the phase C is in the range of $-\pi/2 \leq C \leq \pi/2$, and C may also be in either of quadrants 2 or 3. In other words $C = \pi - \arcsin(Y_0/A)$ where $Y_0$ is positive, or $C = -\pi - \arcsin(Y_0/A)$ where $Y_0$ is negative. The quadrant of C can be determined from the signs and magnitudes of $Y_0$, $Y_1$ and $Y_2$. Finally:

$B = (\arcsin(Y_1/A) - C) f_s/2\pi$, or $B = (\arcsin(Y_2/A) - C) f_s/4\pi$

Once the phase value C is known, the frequency B may be determined with the same quadrant uncertainty as discussed above in relation to the phase C. However, since there are only two quadrant possibilities for B, and there are only two equations, a unique solution can be obtained.

The solution to the above-noted equations for amplitude, frequency and phase may be executed by means of high speed digital signal processing circuitry. However, a better alternative is provided by implementing a sinusoidal best-fit algorithm using a high speed table lookup for establishing the frequency and amplitude characteristics of the pulse signal.

In particular, assuming an output of n bits from the high speed analog-to-digital converter 5, each set of three n bit samples (e.g. $Y_0$, $Y_1$ and $Y_2$) results in only $2^{3n}$ possible combinations of points. For each set of points there is only one distinct value for phase, frequency and amplitude. Thus, the determination of phase, frequency and amplitude may be implemented by means of a lookup table. For example, utilizing a 4 bit analog-to-digital converter, there will be 4,096 different points (i.e. 4K) and for an 8 bit analog-to-digital converter, there will be 16 Meg possible combinations of phase, frequency and amplitude.

Thus, in operation, incoming microwave signals are received via antenna 1 and downconverted to intermediate frequency (IF) signals via converter 3. After down conversion within converter 3, the high speed analog-to-digital converter 5 digitizes the received intermediate frequency (IF) radar signal and stores the converted data into high speed cache FIFO 7. The data from the FIFO 7 is then applied, three samples at a time, to address inputs of respective frequency and amplitude lookup tables 9 and 11. For example, in the event of an 8-bit converter 5, three 8-bit samples are combined as a 24-bit address input to 16 Meg frequency and amplitude lookup tables 9 and 11 which are stored with all possible combinations of frequency and amplitude corresponding to the sampled radar signal. Thus, the digital output signals from lookup tables 9 and 11 are comprised of the intrapulse amplitude and frequency versus time of the received radar pulse. Using this information, a pattern matching processor compares the amplitude and frequency versus time with a plurality of library patterns stored within library memory circuit 15 in order to identify the remote transmitter.

The pattern match processor 13 can be one of any well known systolic array processors, such as those manufactured by NCR Ltd., and in conjunction with library memory circuit 15, the pattern match processor 13 compares the detected frequency and amplitude characteristics with those of well known existing radar transmitters in order to identify the source of the received pulse microwave signal.

Turning briefly to FIG. 3, the error involved in a three point sinusoidal best-fit approximation can be determined as follows. The slope m of the graph in FIG. 3 represents the frequency of an incoming microwave signal (i.e. the change in amplitude with respect to time).

Hence, $\Delta t = 2/f_s$ and $\Delta A = 2w/f_s$. The maximum error on $\Delta A$ is given by $\pm 1/2^n$. Therefore, the error on $$\Delta A = \frac{2W}{f_s} \pm \frac{1}{2^n},$$

and the slope $$w = \frac{\Delta A}{\Delta t} = \frac{\frac{2w}{f_s} \pm \frac{1}{2^n}}{2/f_s}$$

$$= w \pm \frac{1}{2^n} \cdot \frac{f_s}{2}$$

$$= w \pm \frac{f_s}{2^{n+1}}$$

Thus, the error in frequency is given by $$\Delta f = \pm \frac{f_s}{2^{n+2}}$$

For example, with a sampling frequency of 1.2 gigahertz per second, and an 8-bit analog-to-digital converter 5, the error in frequency is equal to $\pm 373$ kilohertz over three samples.

As discussed above, samples are applied in groups of three to the address inputs of frequency and amplitude lookup tables 9 and 11. For example, input samples $Y_0$, $Y_1$ and $Y_2$ are first concatenated and applied to the lookup tables. Next, samples $Y_1$, $Y_2$ and $Y_3$ are applied to the lookup tables, and thereafter samples $Y_2$, $Y_3$ and $Y_4$ are applied to the lookup tables, etc.

In summary, the intrapulse microwave receiver according to the present invention detects frequency and amplitude information characteristics of the leading edge component of received microwave signal pulses as well as the steady state intrapulse characteristics. As discussed, the leading edge characteristics are highly distinctive of individual microwave radar transmitters and can be advantageously used to identify remote transmitters. Furthermore, the high speed digital conversion circuitry of the present invention in conjunction with a table lookup and pattern matching algorithm results in a real time microwave signal detection system as contrasted with prior art digital FFT systems.

A person understanding the present invention may conceive of other embodiments or variations therein.

For example, the microwave detection system of the present invention may be utilized to provide pulse de-interleaving of received signals in a dense signal environment since the inventive receiver operates on an intrapulse basis as opposed to prior art pulse-by-pulse IFM systems. Thus, complex pulse trains which may use multi-level staggers and random jitter of the pulse position can be sorted or de-interleaved for each unique remote transmitter. The receiver can also be used as a stand alone electronic intelligence receiver or as an auxiliary receiver to aid conventional electronic support measure (ESM) receivers in order to sort signal ambiguities caused by high pulse densities from multiple transmitters on the same bearing (i.e. transmitters in the same bearing cell which are close in frequency).

All such variations or modifications are believed to be within the sphere and scope of the present invention as defined by the claims appended hereto.

I claim:
1. An intrapulse microwave radar receiver, comprised of:
   (a) first means for receiving and down-converting an incoming microwave signal and in response generating an intermediate analog signal,
   (b) second means for receiving and digitizing said intermediate analog signal and in response generating a plurality of digital signal samples, and
   (c) third means for receiving said digital signal samples in groups of three, performing a three point best-fit sinusoidal approximation of said digital signal samples and in response generating further digital signals representative of the intrapulse frequency and amplitude of said incoming microwave signal with respect to time.

2. An intrapulse microwave radar receiver as defined in claim 1, wherein said third means is comprised of memory circuit means for receiving each group of three digital signal samples on address inputs thereof, addressing respective frequency and amplitude lookup tables stored therewithin, and in response generating said further digital signals, each said further digital signals forming a unique solution of said intrapulse frequency and amplitude for each said group of three digital signal samples.

3. An intrapulse microwave radar receiver as defined in claim 2, wherein each said plurality of digital signal samples is comprised of n bits, and each said lookup tables contains $2^{3n}$ possible combinations of said frequency and amplitude for each said group of three digital signal samples.

4. An intrapulse microwave radar receiver as defined in claim 1, wherein said second means is comprised of a 4 bit analog-to-digital converter, and said memory circuit means is comprised of a pair of 4 K random access memories each storing 4096 values of respective ones of said frequency and amplitude lookup tables.

5. An intrapulse microwave radar receiver as defined in claim 1, wherein said second means is comprised of an 8 bit analog-to-digital converter, and said memory circuit means is comprised of a pair of 16 Meg random access memories each storing 16777216 values of respective ones of said frequency and amplitude lookup tables.

6. An intrapulse microwave radar receiver as defined in claim 1, further comprised of a pattern matching processor for receiving and comparing said further digital signals with a plurality of stored library signals representative of transmission characteristics of known radar transmitters, and in the event said further digital signals and said stored library signals are substantially equal generating an output signal for identifying which of said known radar transmitters is transmitting said incoming microwave signal.

7. An intrapulse microwave radar receiver as defined in claim 1, further comprised of a high speed cache FIFO for receiving and temporarily storing said digital signal samples, and thereafter applying said digital signal samples to said third means.

8. A method for receiving and detecting microwave radar signals, comprising the steps of:
   (a) receiving and down-converting an incoming microwave signal and in response generating an intermediate analog signal,
   (b) receiving and digitizing said intermediate analog signal and in response generating a plurality of digital signal samples, and (c) receiving and processing said digital signal samples in groups of three, performing a three point best-fit sinusoidal approximation of said digital signal samples and in response generating further digital signals representative of the intrapulse frequency and amplitude of said incoming microwave signal with respect to time.

9. A method as defined in claim 8, further comprising the steps of receiving and comparing said further digital signals with a plurality of stored library signals representative of transmission characteristics of known radar transmitters, and in the event said further digital signals and said stored library signals are substantially equal generating an output signal for identifying which of said known radar transmitters is transmitting said incoming microwave signal.

10. A method as defined in claim 8, wherein said analog signal is digitized at a sampling rate of $f_s$, each group of three digital signal samples is designated as $Y_0$, $Y_1$, and $Y_2$, and said intrapulse amplitude for each said group of three digital signal samples is given by $$A = \frac{}{2Y_1 \sqrt{(ABS((Y_1Y_2 - Y_1^2)/(Y_0 + 2Y_1 + Y_2)(Y_0 - 2Y_1 + Y_2))}} ;$$

the phase for each said group of three digital signal samples is given by $C = \arcsin(Y_0/A)$: and the frequency for each said group of three digital signal samples is given by $B = (\arcsin(Y_1/A) - C) f_s / 2$.

11. An intrapulse microwave radar receiver as defined in claim 2, wherein said second means is comprised of a 4 bit analog-to-digital converter, and said memory circuit means is comprised of a pair of 4K random access memories each storing 4096 values of respective ones of said frequency and amplitude lookup tables.

12. An intrapulse microwave radar receiver as defined in claim 3, wherein said second means is comprised of a 4 bit analog-to-digital converter, and said memory circuit means is comprised of a pair of 4 K random access memories each storing 4096 values of respective ones of said frequency and amplitude lookup tables.

13. An intrapulse microwave radar receiver as defined in claim 2, wherein said second means is comprised of an 8 bit analog-to-digital converter, and said memory circuit means is comprised of a pair of 16 Meg random access memories each storing 16777216 values of respective ones of said frequency and amplitude lookup tables.

14. An intrapulse microwave radar receiver as defined in claim 3, wherein said second means is comprised of an 8 bit analog-to-digital converter, and said memory circuit means is comprised of a pair of 16 Meg random access memories each storing 16777216 values of respective ones of said frequency and amplitude lookup tables.

15. An intrapulse microwave radar receiver as defined in claim 2, further comprised of a pattern matching processor for receiving and comparing said further digital signals with a plurality of stored library signals representative of transmission characteristics of known radar transmitters, and in the event said further digital signals and said stored library signals are substantially equal generating an output signal for identifying which of said known radar transmitters is transmitting said incoming microwave signal.

16. An intrapulse microwave radar receiver as defined in claim 3, further comprised of a pattern matching processor for receiving and comparing said further digital signals with a plurality of stored library signals representative of transmission characteristics of known radar transmitters, and in the event said further digital signals and said stored library signals are substantially equal generating an output signal for identifying which of said known radar transmitters is transmitting said incoming microwave signal.

17. An intrapulse microwave radar receiver as defined in claim 2, further comprised of a high speed cache FIFO for receiving and temporarily storing said digital signal samples, and thereafter applying said digital signal samples to said third means.

18. An intrapulse microwave radar receiver as defined in claim 3, further comprised of a high speed cache FIFO for receiving and temporarily storing said digital signal samples, and thereafter applying said digital signal samples to said third means.

19. A method as defined in claim 9, wherein said analog signal is digitized at a sampling rate of $f_s$, each group of three digital signal samples is designated as $Y_0$, $Y_1$, and $Y_2$, and said intrapulse amplitude for each said group of three digital signal samples is given by $$A = \frac{}{2Y_1 \sqrt{(ABS((Y_1Y_2 - Y_1^2)/(Y_0 + 2Y_1 + Y_2)(Y_0 - 2Y_1 + Y_2))}} ;$$

the phase for each said group of three digital signal samples is given by $C = \arcsin(Y_0/A)$: and the frequency for each said group of three digital signal samples is given by $B = (\arcsin(Y_1/A) - C) f_s / 2$.

* * * * *